United States Patent [19]

Laskaris et al.

[11] Patent Number: 5,381,122
[45] Date of Patent: Jan. 10, 1995

[54] OPEN MRI MAGNET HAVING A SUPPORT STRUCTURE

[75] Inventors: Evangelos T. Laskaris, Schenectady; Constantinos Minas, Slingerlands, both of N.Y.

[73] Assignee: General Electric Company, Schenectady, N.Y.

[21] Appl. No.: 181,514

[22] Filed: Jan. 14, 1994

[51] Int. Cl.⁶ .................... H01F 1/00; H01F 5/00; G01V 3/00
[52] U.S. Cl. .................... 335/216; 335/299; 324/318
[58] Field of Search ........... 335/216, 296, 297, 299; 324/248, 318, 319

[56] References Cited

U.S. PATENT DOCUMENTS

| | | | |
|---|---|---|---|
| 4,829,252 | 5/1989 | Kaufman | 324/309 |
| 4,833,434 | 5/1989 | Takechi | 335/217 |
| 4,875,485 | 10/1989 | Matsutani . | |
| 4,924,198 | 5/1990 | Laskaris . | |
| 4,935,714 | 6/1990 | Vermilyea | 335/299 |
| 4,986,078 | 1/1991 | Laskaris . | |
| 5,003,276 | 3/1991 | Sarwinski et al. . | |
| 5,032,869 | 7/1991 | Herd et al. . | |
| 5,034,713 | 7/1991 | Herd et al. . | |
| 5,075,624 | 12/1991 | Bezjak | 324/318 |
| 5,083,105 | 1/1992 | Herd et al. . | |
| 5,153,546 | 10/1992 | Laskaris | 335/216 |
| 5,184,074 | 2/1993 | Kaufman | 324/309 |
| 5,194,810 | 3/1993 | Breneman | 324/319 |
| 5,237,300 | 8/1993 | Ige | 335/299 |
| 5,291,169 | 3/1994 | Ige | 335/216 |
| 5,304,932 | 4/1994 | Carlson | 324/318 |
| 5,305,749 | 4/1994 | Li | 128/653.2 |

*Primary Examiner*—Leo P. Picard
*Assistant Examiner*—Stephen T. Ryan
*Attorney, Agent, or Firm*—Douglas E. Erickson; Paul R. Webb, II

[57] ABSTRACT

An open magnetic resonance imaging (MRI) magnet having first and second spaced-apart superconductive coil assemblies connected by spaced-apart structural posts each having a first end portion attached to the coil form of the first coil assembly and a second end portion attached to the coil form of the second coil assembly. Each toroidal shaped coil form has radially spaced-apart inner and outer generally cylindrical shells and has longitudinally spaced-apart inner and outer annular plates each attached to the inner and outer cylindrical shells. A superconductive coil surrounds, and is attached to, the outer surface of the outer cylindrical shell.

10 Claims, 4 Drawing Sheets

OPEN MRI MAGNET HAVING A SUPPORT STRUCTURE

BACKGROUND OF THE INVENTION

The present invention relates generally to an open superconductive magnet used to generate a uniform magnetic field as part of a magnetic resonance imaging (MRI) diagnostic system, and more particularly to such a magnet having a support structure for a high magnetic field strength.

MRI systems employing superconductive or other type magnets are used in various fields such as medical diagnostics. Open magnets employ two spaced-apart superconductive coil assemblies (or other magnet pole assemblies) with the space between the assemblies allowing for access by medical personnel for surgery or other medical procedures during MRI imaging. The patient may be positioned in that space or also in the bore of annular coil assemblies. The open space helps the patient overcome any feelings of claustrophobia that may be experienced in a closed magnet design. Known open magnet support systems include "C"-shaped supports with the superconductive coil assemblies (or other magnet pole assemblies) being attached to the open top and bottom ends of the "C". Other known support systems include structural posts whose ends are attached to the two superconductive coil assemblies (or other magnet pole assemblies) including attachment to the coil forms (which hold the superconductive coils) of such superconductive coil assemblies. These support systems may be adequate for low field strength magnets, but a more robust support system is desired when the open magnets have a high field strength, including one Tesla or higher, where the attraction forces between the toroidal-shaped superconductive coil assemblies can be in excess of 160,000 pounds.

SUMMARY OF THE INVENTION

It is an object of the invention to provide an open MRI magnet having a robust but lightweight support structure for magnets of high magnetic field strength.

It is another object of the invention to provide such a magnet whose support structure also facilitates the cooling of the superconductive coil of the MRI magnet to below its critical temperature.

It is a further object of the invention to provide such a magnet whose support structure for the MRI magnet's coil form (which holds the superconductive coil), surrounding thermal shield, and surrounding vacuum vessel also allows for adjustment of the space between the coil form and vacuum vessel.

The open MRI magnet of the invention includes first and second superconductive coil assemblies and structural posts attached to the generally toroidal-shaped coil forms of the coil assemblies. The coil forms each have radially spaced-apart inner and outer generally cylindrical shells and longitudinally spaced-apart inner and outer generally annular plates. The inner and outer annular plates are each attached to both the inner and outer cylindrical shells. A superconductive coil surrounds and is attached to the outer surface of the outer cylindrical shell.

In a preferred embodiment, the first coil assembly also includes a thermally conductive ring contacting the coil form and a thermally conductive tube surrounding each of the posts, extending between the coil assemblies, and contacting the thermally conductive ring.

In another preferred embodiment, a thermal shield generally surrounds the coil form, a vacuum vessel generally surrounds the thermal shield, and a mechanism is provided for adjusting the spacing between the coil form and the vacuum vessel.

Several benefits and advantages are derived from the invention. The hollow toroidal-shaped coil form provides a lightweight robust support structure for the superconductive coil. The thermally conductive ring and thermally conductive tube provide radial heat transfer around the toroidal superconductive coil form and provide longitudinal heat transfer between the coil forms of the two coil assemblies. The adjustment mechanism allows for correction of misalignments that may have occurred during shipping.

BRIEF DESCRIPTION OF THE DRAWINGS

The accompanying drawings illustrate a preferred embodiment of the present invention wherein:

FIG. 4 is a perspective view of the thermal shield removed from the first coil assembly of the MRI magnet of the invention;

DETAILED DESCRIPTION OF THE INVENTION

Figure 1:
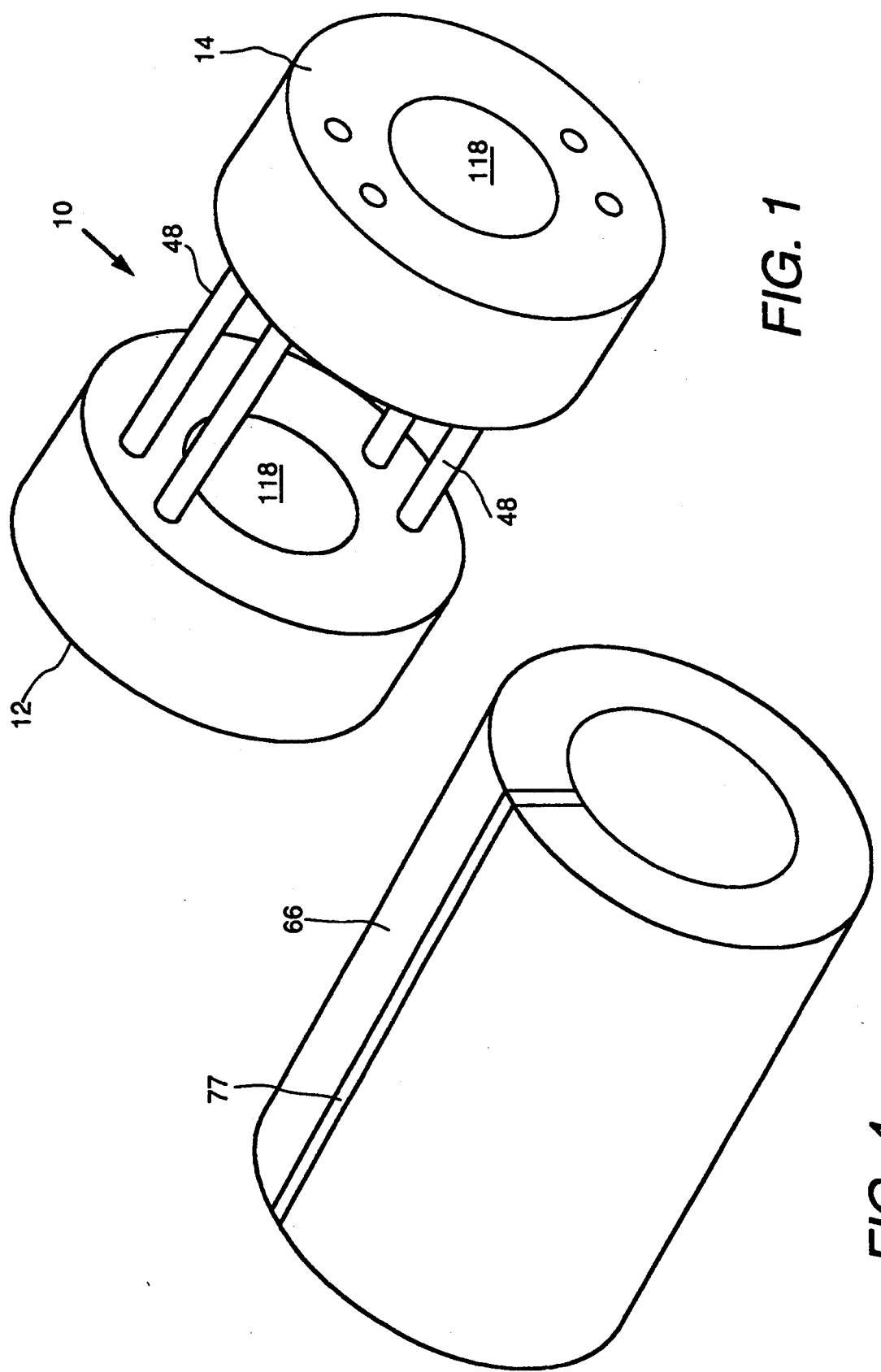
FIG. 1 is a perspective view of the open MRI magnet of the invention having two spaced-apart superconductive coil assemblies with the accompanying cryocooler and magnet floor mount omitted for clarity.
Figure 2:
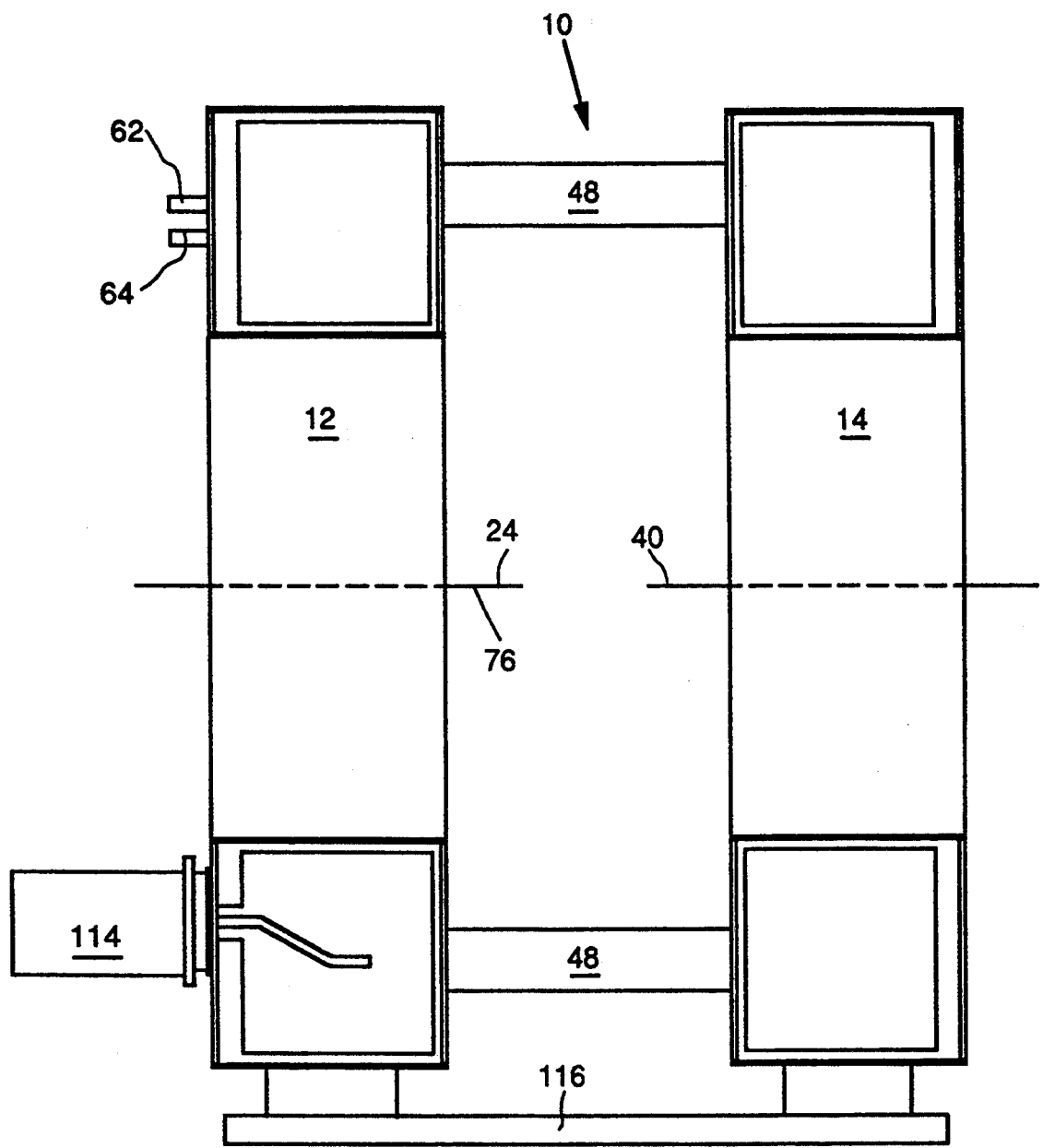
FIG. 2 is a schematic side elevational view of the MRI magnet of FIG. 1 with its accompanying cryocooler and magnet floor mount added.
Figure 3:
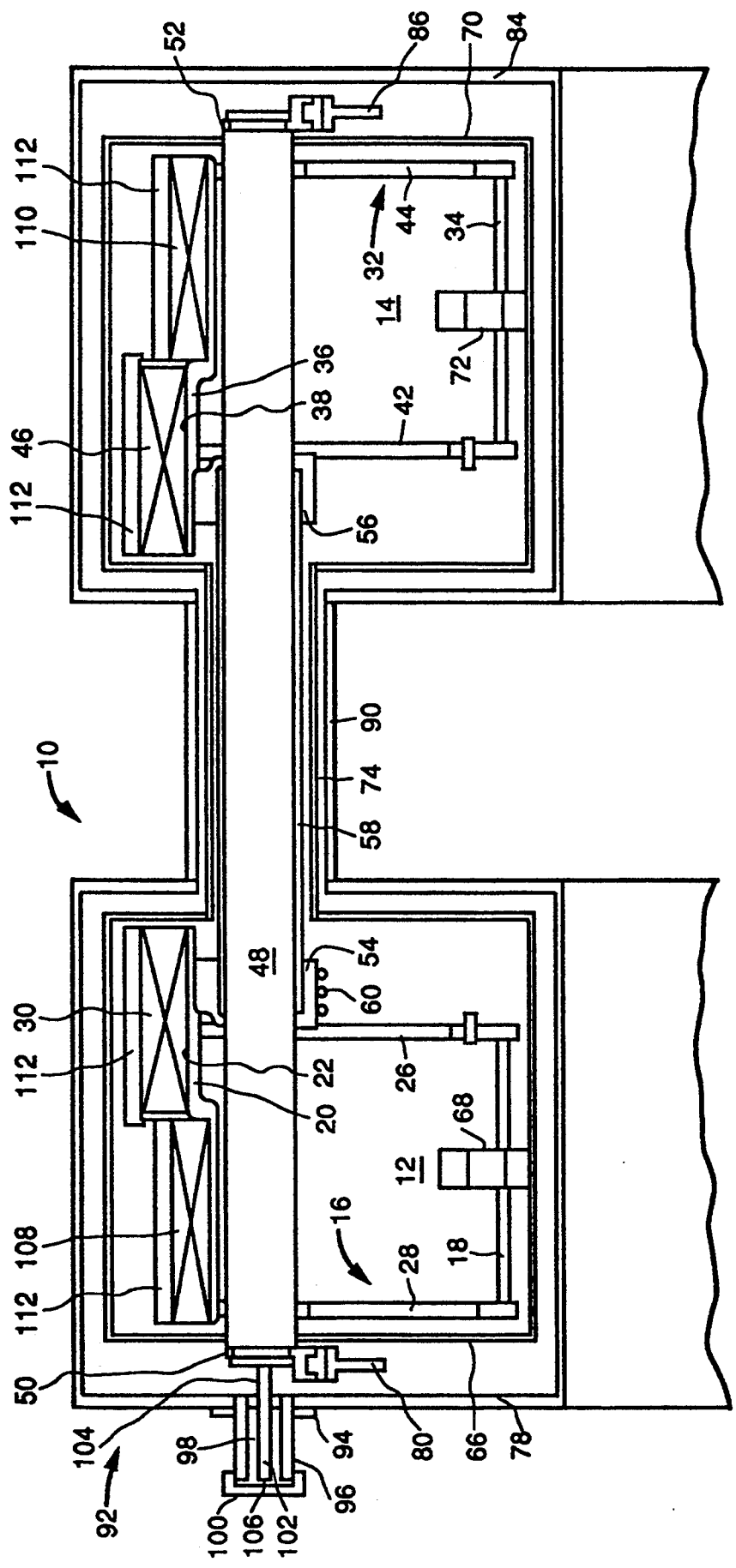
FIG. 3 is an enlarged detailed view of the upper portion of FIG. 2.

Referring now to the drawings, wherein like numerals represent like elements throughout, FIGS. 1–3 show the open magnetic resonance imaging (MRI) magnet 10 of the present invention. The magnet 10 includes first and second spaced-apart superconductive coil assemblies 12 and 14. Open magnets of high field strength, including one Tesla or higher, have attraction forces between magnet toroid coil assemblies 12 and 14 which can be in excess of 160,000 pounds. The coil assemblies 12 and 14 must be supported without excessive bending displacements or stresses which may cause premature quench, structural failure, or large uncorrectable field inhomogeneity.

As seen from FIGS. 2 and 3, the first coil assembly 12 includes a generally toroidal-shaped coil form 16 having radially spaced apart inner and outer generally cylindrical shells 18 and 20. The outer cylindrical shell 20 has an outer surface 22, and the inner cylindrical shell 18 has a generally horizontally extending longitudinal axis 24. The coil form 16 of the first coil assembly 12 also has longitudinally spaced-apart inner and outer generally annular plates 26 and 28 each attached to both said inner and outer cylindrical shells 18 and 20. The first coil assembly 12 also includes a superconductive coil 30 which surrounds, and is attached to, the outer surface 22 of the outer cylindrical shell 20.

Likewise, the second coil assembly 14 includes a generally toroidal-shaped coil form 32 having radially spaced apart inner and outer generally cylindrical shells 34 and 36. The outer cylindrical shell 36 has an outer surface 38, and the inner cylindrical shell 34 has a generally horizontally extending longitudinal axis 40. The coil form 32 of the second coil assembly 14 also has longitudinally spaced-apart inner and outer generally annular plates 42 and 44 each attached to both said inner and outer cylindrical shells 34 and 36. The second coil assembly 14 also includes a superconductive coil 46 which surrounds, and is attached to, the outer surface 38 of the outer cylindrical shell 36.

The longitudinal axis 24 of the inner cylindrical shell 18 of the coil form 16 of the first coil assembly 12 is generally coaxially aligned with the longitudinal axis 40 of the inner cylindrical shell 34 of the coil form 32 of the second coil assembly 14.

The magnet 10 also includes a plurality of spaced-apart structural posts 48 each having a first end portion 50 attached to the coil form 16 of the first coil assembly 12 and each having a second end portion 52 attached to the coil form 32 of the second coil assembly 14. Such construction of the magnet 10 increases the moment of inertia of the structure and reduces the axial bending caused by the large magnetic compressive forces at the farthest circumferential location of the first and second coil assemblies 12 and 14 from the structural posts 48. Thus, the coil assemblies 12 and 14 can be robustly supported by a hollow (and hence lightweight) toroidal-shaped coil form design.

Preferably, the first coil assembly 12 also includes a thermally conductive ring 54 having a coefficient of thermal conductivity higher than that of said coil form 16 of said first coil assembly 12 and contacting said coil form 16 of the first coil assembly 12. The second coil assembly 14 likewise also includes a thermally conductive ring 56 having a coefficient of thermal conductivity higher than that of the coil form 32 of said second coil assembly 14 and contacting the coil form 32 of the second coil assembly 14. A thermally conductive tube 58 has a coefficient of thermal conductivity higher than that of the structural posts 48, surrounds each of the structural pests 48, extends between the first and second coil assemblies 12 and 14, and contacts the thermally conductive ring 54 of the first coil assembly 12 and the thermally conductive ring 56 of the second coil assembly 14. The thermally conductive rings 54 and 56 and thermally conductive tube 58 provide a uniform temperature distribution circumferentially for each coil form 16 and 32 and provide a uniform temperature distribution axially between the two coil forms 16 and 32 of the two coil assemblies 12 and 14. A heat exchanger coil 60 contacts the thermally conductive ring 54 of the first coil assembly 12, and the heat exchanger coil 60 has an inlet 62 and an outlet 64 disposed outside the first coil assembly 12.

As seen from FIG. 3, the first end portion 50 of each structural post 48 (only one of which is shown in the figure) is disposed between its associated outer and inner cylindrical shells 20 and 18 proximate its associated outer cylindrical shell 20, and the first end portion 50 of each structural post 48 extends through its associated inner annular plate 26 and is attached to its associated outer annular plate 28. Likewise, the second end portion 52 of each structural post 48 is disposed between its associated outer and inner cylindrical shells 36 and 34 proximate its associated outer cylindrical shell 36, and the second end portion 52 of each structural post 48 extends through its associated inner annular plate 42 and is attached to its associated outer annular plate 44.

The first coil assembly 12 also includes a thermal shield 66 generally spaced apart from, and generally surrounding, the coil form 16 of the first coil assembly 12. The first end portion 50 of each structural post 48 extends through its associated outer annular plate 28 and extends through the thermal shield 66 without contacting the thermal shield 66. The thermal shield 66 is spaced from the coil form 16 by thermal insulating tubes 68. Likewise, the second coil assembly 14 also includes a thermal shield 70 generally spaced apart from, and generally surrounding, the coil form 32 of the second coil assembly 14. The second end portion 52 of each structural post 48 extends through its associated outer annular plate 44 and extends through the thermal shield 70 without contacting the thermal shield 70. The thermal shield 70 is spaced from the coil form 32 by thermal insulating tubes 72. A thermal shield connecting tube 74 is spaced apart from and coaxially surrounds each structural post 48 and the thermally conductive tube 58. The thermal shield connecting tube 74 structurally and thermally connects the two thermal shields 66 and 70 to form a complete thermal shielding. As seen from FIGS. 3 and 4, the thermal shield 66 of the first coil assembly 12 has a generally toroidal shape with a longitudinal axis 76 generally coaxially aligned with the longitudinal axis 24 of the inner cylindrical shell 18 of the coil form 16 of the first coil assembly 12. As seen from FIG. 4, the thermal shield 66 has a radial through cut with an electrical insulator 77 disposed therein. The thermal shield 70 of the second coil assembly 14 likewise has a radial through cut and an electrical insulator disposed therein (not shown in the figures). During quench of a superconductive coil 30 and 46, the thermal shield 66 and 70 could be subjected to large implosive pressures that can cause structural failure. The radial-cut thermal shield design prevents circulation of circumferential currents which could produce these high transient forces.

Figure 5:
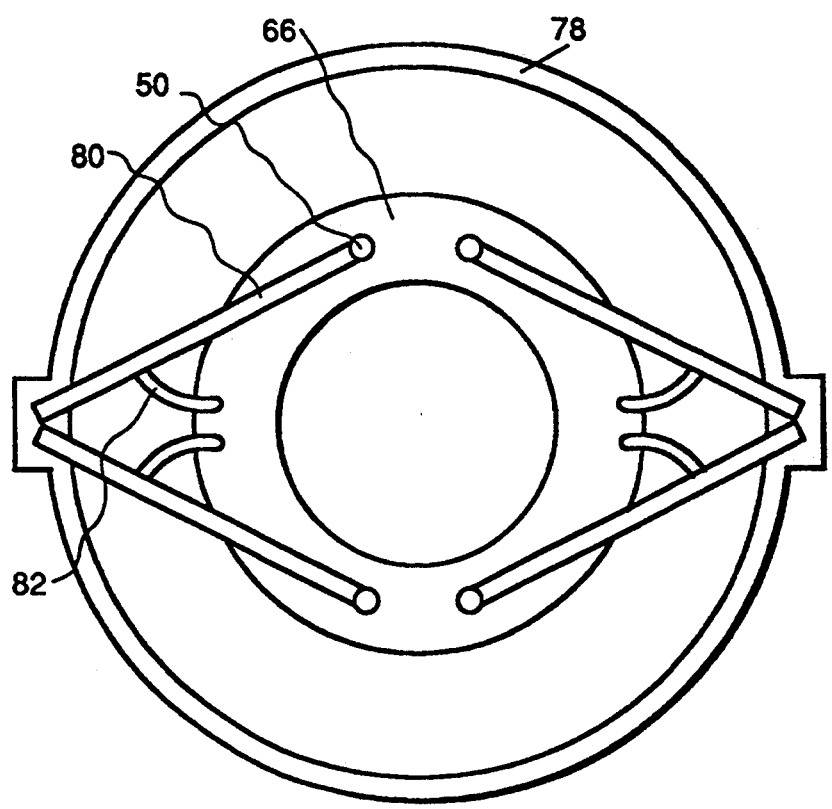
FIG. 5 is a cutaway end view of one end of the MRI magnet of FIG. 1 exposing the thermal shield of the first coil assembly.
Figure 6:
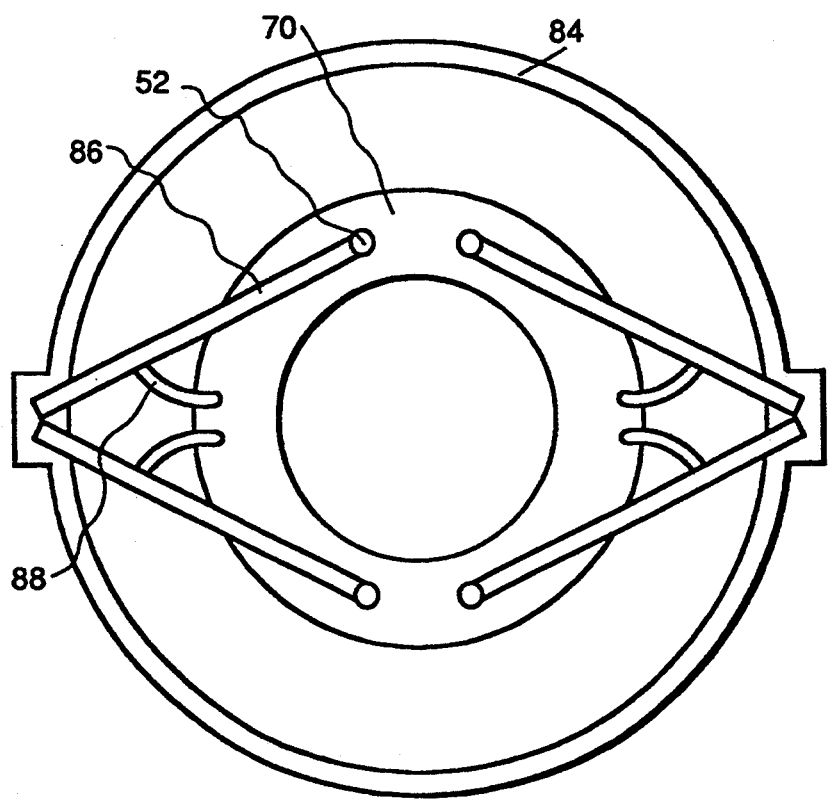
FIG. 6 is a cutaway end view of the other end of the MRI magnet of FIG. 1 exposing the thermal shield of the second coil assembly.

As seen from FIGS. 3 and 5, the first end portion 50 of each structural post 48 extends through the thermal shield 66 of the first coil assembly 12, a vacuum vessel 78 is generally spaced apart from and generally surrounds the thermal shield 66, and a tie rod strap 80 attaches the first end portion 50 to the inside of the vacuum vessel 78. A thermal braid 82 thermally connects the tie rod strap 80 to the thermal shield 66. Likewise, and as seen from FIGS. 3 and 6, the second end portion 52 of each structural post 48 extends through the thermal shield 70 of the second coil assembly 14, a vacuum vessel 84 is generally spaced apart from and generally surrounds the thermal shield 70, and a tie rod strap 86 attaches the second end portion 52 to the inside of the vacuum vessel 84. A thermal braid 88 thermally connects the tie rod strap 86 to the thermal shield 70. A vacuum vessel connecting tube 90 is spaced apart from and coaxially surrounds each thermal shield connecting tube 74. The vacuum vessel connecting tube 90 structurally connects the two vacuum vessels 78 and 84 to form a complete vacuum compartment.

In an exemplary design, as shown in FIG. 3, the vacuum vessel 78 has an opening proximate one of the first end portions 50 of the structural posts 48, and the MRI magnet 10 also includes means 92 for adjusting the spacing between the coil form 16 and the vacuum vessel 78 from outside the vacuum vessel 78 with such means 92 disposed in the opening. Preferably such means 92 includes: a mounting plate 94 attached to the outside of the vacuum vessel 78 and having an outside threaded boss 96 with a through bore 98; an adjusting nut 100 threadably engaging the boss 96; and a bumper tube 102 disposed within the bore 98, having a first end 104 attached to the one first end portion 50 of the structural post 48, and having a second free end 106. Other such means 92 includes conventional adjustable axial displacement mechanisms, as can be appreciated by those skilled in the art. Use of additional means 92 for the first and/or second end portions 50 and 52 of other structural posts 48 is left to the artisan as well as use of similar mechanisms (not shown in the figures) at other circumferential locations on the ends of the vacuum vessel 78 and 84 not associated with circumferential locations of the structural posts 48.

The magnet 10 of the invention provides structural support, high heat conduction path, and adjustable suspension for the superconductive coils 30 and 46. Exemplary design details include an additional superconductive coil 108 for the first coil assembly 12 and an additional superconductive coil 110 for the second coil assembly 14, and an aluminum or stainless steel ring 112 shrunk on the outside of each superconductive coil 30, 46, 108, and 110 to keep the coil form 16 and 32 under compression, as can be appreciated by those skilled in the art. Conventional correction coils (not shown in the figures) may also be employed. As seen from FIG. 2, a conventional cryocooler 114, whose second stage is in cooling contact with the thermally conductive ring 54 and whose first stage is in cooling contact with the thermal shield 66 (such contact not shown in the figures), and a magnet floor mount 116 are associated with the MRI magnet 10. Typically the superconductive coils 30, 46, 108, and 110 are cooled to generally ten degrees Kelvin and the thermal shields 66 and 70 are cooled to generally forty degrees Kelvin.

In an exemplary cooling technique to reach superconductivity, a cryogenic liquid is supplied to the inlet 62 of the heat exchanger coil 60 to provide a rapid cool down of the magnet 10 after which the supply is stopped and the cryocooler 114 is solely relied on to achieve and maintain a below critical temperature for the superconductive coils 30, 46, 108 and 110.

Preferably, the coil forms 16 and 32 and the structural posts 48 are nonmagnetic stainless steel, the thermal shields 66 and 70 are aluminum, the thermally conductive rings 54 and 56 and thermally conductive tube 58 are copper, the thermal insulating tubes 68 and 72 are radial filamentary carbon graphite, the tie rod straps 80 and 86 are racetrack-shaped filamentary glass or carbon graphite, and the superconductive coils 30, 46, 108, and 110 are niobium-tin tape wound and epoxy impregnated. Preferably, the inner 26 and 42 and outer 28 and 44 annular plates are each welded to both the inner 18 and 34 and outer 20 and 36 cylindrical shells of their associated coil form 16 and 32, and the structural posts 48 are welded to the coil forms 16 and 32 to provide support such that the maximum vertical displacement between coil forms 16 and 32 is one-hundredth of an inch.

The foregoing description of a preferred embodiment of the invention has been presented for purposes of illustration. It is not intended to be exhaustive or to limit the invention to the precise form disclosed, and obviously many modifications and variations are possible in light of the above teaching. For example, preferably there are four structural posts 48 with the top posts spread apart generally one hundred fifty degrees from the bottom posts, with a generally twenty-degree angle between the top posts, and with a generally forty-degree angle between the bottom posts to allow convenient side access by medical personnel for surgery or other procedures during imaging of the patient who may be placed on a table (not shown in the figures) entering the imaging volume of the magnet 10 from the other side of the magnet or through the bore 118 of one of the coil assemblies 12 or 14. However, a different number of structural posts 48 or different angular positioning of the posts 48 for a particular imaging application is left to the artisan. It is intended that the scope of the invention be defined by the claims appended hereto.

We claim:

1. An open magnetic resonance imaging magnet comprising:
    a) first and second spaced-apart superconductive coil assemblies each including:
        (1) a generally toroidal-shaped coil form having:
            (a) radially spaced-apart inner and outer generally cylindrical shells, said outer cylindrical shell having an outer surface and said inner cylindrical shell having a generally horizontally extending longitudinal axis, and wherein said longitudinal axis of said inner cylindrical shell of said coil form of said first coil assembly is generally coaxially aligned with said longitudinal axis of said inner cylindrical shell of said coil form of said second coil assembly; and
            (b) longitudinally spaced-apart inner and outer generally annular plates each attached to both said inner and outer cylindrical shells; and
        (2) a superconductive coil surrounding, and attached to, said outer surface of said outer cylindrical shell; and
    b) a plurality of spaced-apart structural posts each having a first end portion attached to said coil form of said first coil assembly and each having a second end portion attached to said coil form of said second coil assembly,
    wherein said first coil assembly also includes a thermally conductive ring having a coefficient of thermal conductivity higher than that of said coil form of said first coil assembly and contacting said coil form of said first coil assembly, and
    wherein said first coil assembly also includes a heat exchanger coil contacting said thermally conductive ring and having an inlet and an outlet disposed outside said first coil assembly.

2. An open magnetic resonance imaging magnet comprising:
    a) first and second spaced-apart superconductive coil assemblies each including:
        (1) a generally toroidal-shaped coil form having
            (a) radially spaced-apart inner and outer generally cylindrical shells, said outer cylindrical shell having an outer surface and said inner cylindrical shell having a generally horizontally extending longitudinal axis and wherein said longitudinal axis of said inner cylindrical shell of said coil form of said first coil assembly is generally coaxially aligned with said longitudinal axis of said inner cylindrical shell of said coil form of said second coil assembly; and (b) longitudinally spaced-apart inner and outer generally annular plates each attached to both said inner and outer cylindrical shells; and (2) a superconductive coil surrounding, and attached to, said outer surface of said outer cylindrical shell; and b) a plurality of spaced-apart structural posts each having a first end portion attached to said coil form of said first coil assembly and each having a second end portion attached to said coil form of said second coil assembly, wherein said first coil assembly also includes a thermally conductive ring having a coefficient of thermal conductivity higher than that of said coil form of said first coil assembly and contacting said coil form of said first coil assembly, and also including a thermally conductive tube having a coefficient of thermal conductivity higher than that of said structural posts, surrounding each of said structural posts, extending between said first and second coil assemblies, and contacting said thermally conductive ring of said first coil assembly.

3. An open magnetic resonance imaging magnet comprising:

a) first and second spaced-apart superconductive coil assemblies each including:

(1) a generally toroidal-shaped coil form having;

(a) radially spaced-apart inner and outer generally cylindrical shells, said outer cylindrical shell having an outer surface and said inner cylindrical shell having a generally horizontally extending longitudinal axis, and wherein said longitudinal axis of said inner cylindrical shell of said coil form of said first coil assembly is generally coaxially aligned with said longitudinal axis of said inner cylindrical shell of said coil form of said second coil assembly; and (b) longitudinally spaced-apart inner and outer generally annular plates each attached to both said inner and outer cylindrical shells; and (2) a superconductive coil surrounding, and attached to, said outer surface of said outer cylindrical shell; and b) a plurality of spaced-apart structural posts each having a first end portion attached to said coil form of said first coil assembly and each having a second end portion attached to said coil form of said second coil assembly, wherein said first end portion is disposed between its associated outer and inner cylindrical shells proximate its associated outer cylindrical shell, and wherein said first end portion extends through its associated inner annular plate and is attached to its associated outer annular plate.

4. The magnet of claim 3, wherein said first coil assembly also includes a thermal shield generally spaced apart from, and generally surrounding, said coil form of said first coil assembly and wherein said first end portion extends through its associated outer annular plate and extends through said thermal shield.

5. The magnet of claim 4, wherein said thermal shield has a generally toroidal shape with a longitudinal axis generally coaxially aligned with said longitudinal axis of said inner cylindrical shell of said coil form of said first coil assembly, and wherein said thermal shield has a radial through cut.

6. The magnet of claim 5, also including an electrical insulator disposed in said radial through cut.

7. The magnet of claim 4, also including:

a) a vacuum vessel generally spaced apart from, and generally surrounding, said thermal shield; and b) a tie rod strap attaching said first end portion to the inside of said vacuum vessel.

8. The magnet of claim 7, also including a thermal braid connecting said tie rod strap to said thermal shield.

9. The magnet of claim 7, wherein said vacuum vessel has an opening proximate one of said first end portions, and also including means for adjusting the spacing between said coil form and said vacuum vessel from outside said vacuum vessel, said means disposed in said opening.

10. The magnet of claim 9, wherein said means includes:

a) a mounting plate attached to the outside of said vacuum vessel and having an outside threaded boss with a through bore;

b) an adjusting nut threadably engaging said boss; and c) a bumper tube disposed within said bore, having a first end attached to said one first end portion, and having a second free end.

* * * * *